United States Patent [19]
Borodovsky et al.

[11] Patent Number: 6,069,739
[45] Date of Patent: May 30, 2000

[54] METHOD AND LENS ARRANGEMENT TO IMPROVE IMAGING PERFORMANCE OF MICROLITHOGRAPHY EXPOSURE TOOL

[75] Inventors: Yan Borodovsky, Portland, Oreg.; Christof Krautschik, Cupertino, Calif.

[73] Assignee: Intel Corporation, Santa Clara, Calif.

[21] Appl. No.: 09/109,299

[22] Filed: Jun. 30, 1998

[51] Int. Cl.[7] .............................. G02B 27/00; G03B 27/54
[52] U.S. Cl. ..................... 359/577; 359/620; 359/667; 359/900; 362/259; 355/67
[58] Field of Search ................................. 359/577, 619, 359/620, 665, 667, 318, 900; 362/259, 318, 3, 16; 353/38, 81, 102; 355/67

[56] References Cited

U.S. PATENT DOCUMENTS

| | | | |
|---|---|---|---|
| 4,619,508 | 10/1986 | Shibuya et al. | 353/122 |
| 4,769,750 | 9/1988 | Matsumoto et al. | 359/628 |
| 4,964,720 | 10/1990 | Torigoe | 353/122 |
| 4,974,919 | 12/1990 | Muraki et al. . | |
| 5,005,969 | 4/1991 | Kataoka | 353/122 |
| 5,216,257 | 6/1993 | Brueck et al. . | |
| 5,343,292 | 8/1994 | Brueck et al. . | |
| 5,415,835 | 5/1995 | Brueck et al. . | |
| 5,426,498 | 6/1995 | Brueck et al. . | |
| 5,463,497 | 10/1995 | Muraki et al. | 359/619 |
| 5,662,410 | 9/1997 | Suganuma | 359/622 |
| 5,674,652 | 10/1997 | Bishop et al. . | |
| 5,705,321 | 1/1998 | Brueck et al. . | |
| 5,719,704 | 2/1998 | Shiraishi et al. | 355/67 |
| 5,933,216 | 8/1999 | Dunn | 355/71 |
| 5,963,305 | 10/1999 | Mizouchi | 355/67 |

OTHER PUBLICATIONS

K.A. Valiev et al., "The Coherence Factors of Excimer Laser Radiation in Projection Lithography," J. Vac. Sci. Technology, B7 (60), Dec./Nov. 1989, at p. 1616.

Yutaka Ichihara et al., "Illumination System of an Excimer Laser Stepper", SPIE vol. 1138 (1989) at p. 137.

*Primary Examiner*—Cassandra Spyrou
*Assistant Examiner*—John Juba, Jr.
*Attorney, Agent, or Firm*—Blakely, Sokoloff, Taylor & Zafman LLP

[57] ABSTRACT

A technique for introducing variable phase delay across portions of a spatially coherent light beam, such as a laser, without changing the focal length of the portions of the beam. A fly's-eye lens array is utilized to distribute the light for a more uniform illumination, but different length air gaps are introduced in the lens elements to provide a variable delay of portions of the beam. In a second scheme, a set of prisms is positioned in the path of the laser beam, in which the shape of the prism introduces variable phase delay across the cross-section of the beam.

19 Claims, 3 Drawing Sheets

METHOD AND LENS ARRANGEMENT TO IMPROVE IMAGING PERFORMANCE OF MICROLITHOGRAPHY EXPOSURE TOOL

BACKGROUND OF THE INVENTION

1. Field of the Invention

The present invention relates to the field of optical lithography and, more particularly, to a specialized lens arrangement for improving imaging performance of lithography tools.

2. Background of the Related Art

The use of optical lithography to pattern devices that are fabricated on a semiconductor wafer (such as a silicon wafer) is well known and has been in practice for many years. Generally, a mask is used in which light absorbing elements present in the mask define a positive or a negative pattern. One common practice is to position light absorbing chrome on a transparent mask material, such as glass (or quartz). The light not absorbed by the chrome is projected through the mask and exposes a photosensitive material to form a latent image therein. Depending on the positive or negative nature of the photomask technique and the photosensitive layer (photoresist) employed, the exposed (or the un-exposed) area is removed. The removed photoresist exposes underlying areas which are then processed by various processes, including etching.

In a typical microlithography tool, a light source is used to illuminate the mask (reticle) so that a pattern present on the mask is projected onto the photoresist to form a latent image in the photoresist. It is preferred to have uniform illumination on the mask by the light source, so that light intensity across the reticle plane is also uniform in intensity. It is appreciated that non-uniform intensity at the reticle plane can result in non-uniform exposure dose of the photoresist. A significant variation in the exposure dose of the photoresist present on a wafer can result in non-uniform feature formation when the integrated circuit is fabricated. For example, non-uniform exposure dose on photoresist can result in sizeable variation in the linewidth of the pattern being imaged.

With ordinary light sources, the light emitted by the source is usually of low optical coherence so that a fairly uniform light intensity profile is achieved at the reticle plane by superposing multiple wavefronts. However, with coherent light sources, such as a laser, the light projection is confined to a collimated beam that is of relatively high coherence. Thus, light intensity across the reticle field is not necessarily uniform as a result of the coherence properties of laser light. In order to obtain a more uniform intensity profile at the reticle plane, some projection systems use a light dispersion mechanism to disperse spatially the light beam from a coherent light source. One such mechanism is a lens arrangement known as a fly's eye array (or fly-eye). A fly's-eye illumination system utilizes a number of lenses arranged as a two dimensional array to disperse the beam into a number of "beamlets" for projection of light onto a target plane. The structure and use of fly-eye lens arrangements are known in the art. See for example "Illumination System of an Excimer Laser Stepper" by Yutaka Ichihara et al., SPIE Vol. 1138 (1989) at p.137.

Although uniform illumination of laser beams can be sought with the use of fly's-eye lens arrangement, a negative effect is noted with the use of coherent light sources. This effect is the spatial coherence associated with narrow band light sources, such as lasers, and the manifestation that is known as speckle. The high degree of spatial coherence of line narrow lasers produces an unwanted interference pattern (speckle) superimposed over ideally uniform light intensity illumination at the reticle plane. The interference effect of spatially coherent light beams producing speckle is known in the art. See for example, "The Coherence Factors of Excimer Laser Radiation in Projection Lithography" by K. A. Valiev et al., J. Vac. Sci. Technology, B7 (60), Dec/Nov 1989 at p.1616.

The present invention describes a scheme in which a fly-eye lens arrangement is used for obtaining uniform light intensity illumination of a narrow band coherent light source, but in which speckle is reduced or removed.

SUMMARY OF THE INVENTION

The present invention describes a technique to improve imaging performance in a microlithography tool by introducing variable phase delay across a spatially coherent light beam, such as a laser. A fly's-eye lens array is utilized to distribute the light for a more uniform illumination at a reticle to project a mask pattern onto a semiconductor wafer. However, when narrow band lasers are employed, the high degree of spatial coherence causes interference effects manifesting as speckle. In order to reduce or remove the speckle, the present invention introduces variable delays across portions of the beam, but without changing the focal length.

In the first embodiment, an array of specialized fly-eye lenses are configured with air gaps present in some of the lens elements. The air gaps change the medium in which a particular beamlet transitions, thereby changing the phase of the beam. The combination of different air gap distances in various lens elements provide for a variable staggered delay of the beamlets travelling through the lens. The introduction of the staggered delay across the cross-section of the beam reduces spatial coherence of the beam reaching the reticle plane.

In the second embodiment, a set of glass prisms is positioned in the path of the laser beam. The shape of the prism causes portions of the beam to transition across a different medium, where this transition path length varies across the cross-section of the beam, which introduces a continuous variable phase delay to further offset the spatial coherence of the beam reaching the reticle plane.

DETAILED DESCRIPTION OF THE INVENTION

A technique for providing a specialized lens arrangement to improve imaging performance in a microlithography tool is described. In the following description, numerous specific details are set forth, such as specific lasers, structures, tools, processes, etc., in order to provide a thorough understanding of the present invention. However, it will be appreciated by one skilled in the art that the present invention may be practiced without these specific details. In other instances, well known techniques and structures have not been described in detail in order not to obscure the present invention.

As noted in the Background section above, microlithography tools having a coherent light source impose some means to distribute the light illumination over a target, in order to improve the uniformity of the illumination. Thus, in reference to lithography tools for use in integrated circuit manufacturing, one location where uniformity of light illumination is desired is at the reticle plane. That is, uniform light illumination is desired at the mask to project the mask pattern with little light distortion as possible. However, when a narrow band (line-narrow) coherent light source (such as a laser) is used, the high degree of spatial coherence leads to constructive and destructive interferences, which effects can be noted at the reticle plane.

Figure 1:
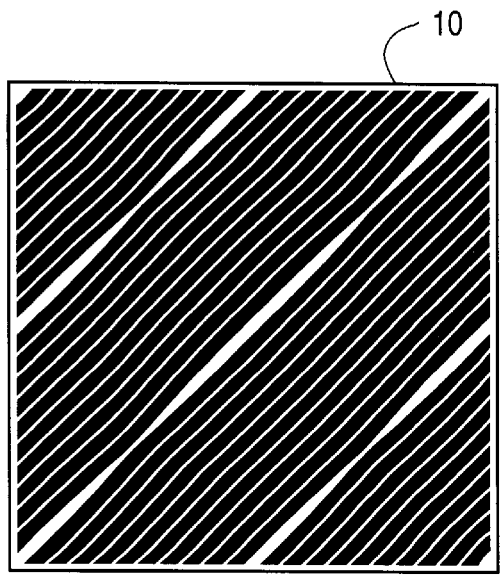
FIG. 1 is a pictorial view of an image pattern in which interference from spatial coherence of a light beam results in speckle.

For example, FIG. 1 shows the results of a one-dimensional mutual coherence function of a partially coherent fly's eye (fly-eye) lens arrangement comprised of a number of fly-eye lenses. Light interference patterns are noted along a forty-five degree axis. The pattern is the result of an undesirable interference effect in the reticle plane, which result is shown as alternating dark and light pattern 10 in FIG. 1. The presence of unwanted modulation in the light intensity illumination over the reticle area can lead to loss of resolution and deterioration of dimensional control of the various features being patterned. As noted, one such deterioration can result in not achieving uniform linewidth across the imaging plane.

The manifestation caused by the interference is referred to as speckle. In some instances, speckle is desirable, or at least utilized for beneficial purposes. See for example, U.S. Pat. No. 5,426,498, in which speckle amplitude interferometry is used in metrology. However, in the present instance, speckle is a non-desirable characteristic. It is appreciated that methods do exist to reduce the unwanted impact of high degree of spatial coherence. One technique relies on speckle averaging, which is achieved through movement of interference fringes during image formation. For example, a mirror is made to oscillate in order to project a pulsing laser beam onto the mask. However, this technique requires a sizeable number of pulses to form an image and the speckle averaging is difficult to achieve. See for example, "Illumination System of an Excimer Laser Stepper" by Yutaka Ichihara et al., SPIE Vol. 1138 (1989) at p.137.

Figure 2:
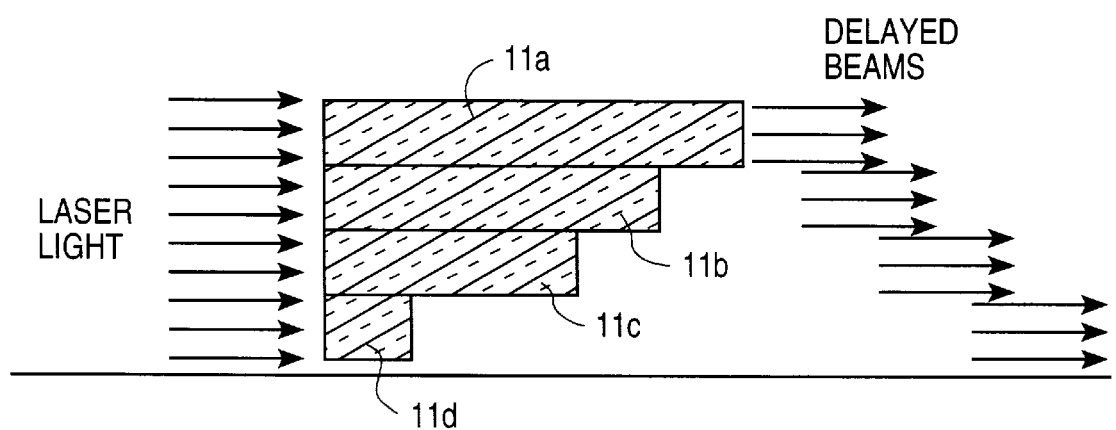
FIG. 2 is a cross-sectional view of a prior art technique in which plane-parallel plates are used to reduce the coherence between adjacent beamlets.

Another technique, which is shown in FIG. 2, relies on splitting a large laser beam into several smaller area beam channels that are passed through different optical paths formed by plane-parallel plates 11a–d, having various thickness to break the coherence between adjacent beamlets. The plates are each of different thickness to introduce delays. A problem with this approach is the requirement of having optical elements of varying length and then having to recombine the individual beams after they exit each separate delay line. When narrow band lasers are employed as a light source, the long coherence path will necessitate the construction of rather lengthy delay elements or delay lines. Typically, these delay elements are constructed from glass or mirrors. With narrow band lasers (in the range of 0.01 Angstroms) these delay elements or paths can be about 10 centimeters or larger.

Figure 3:
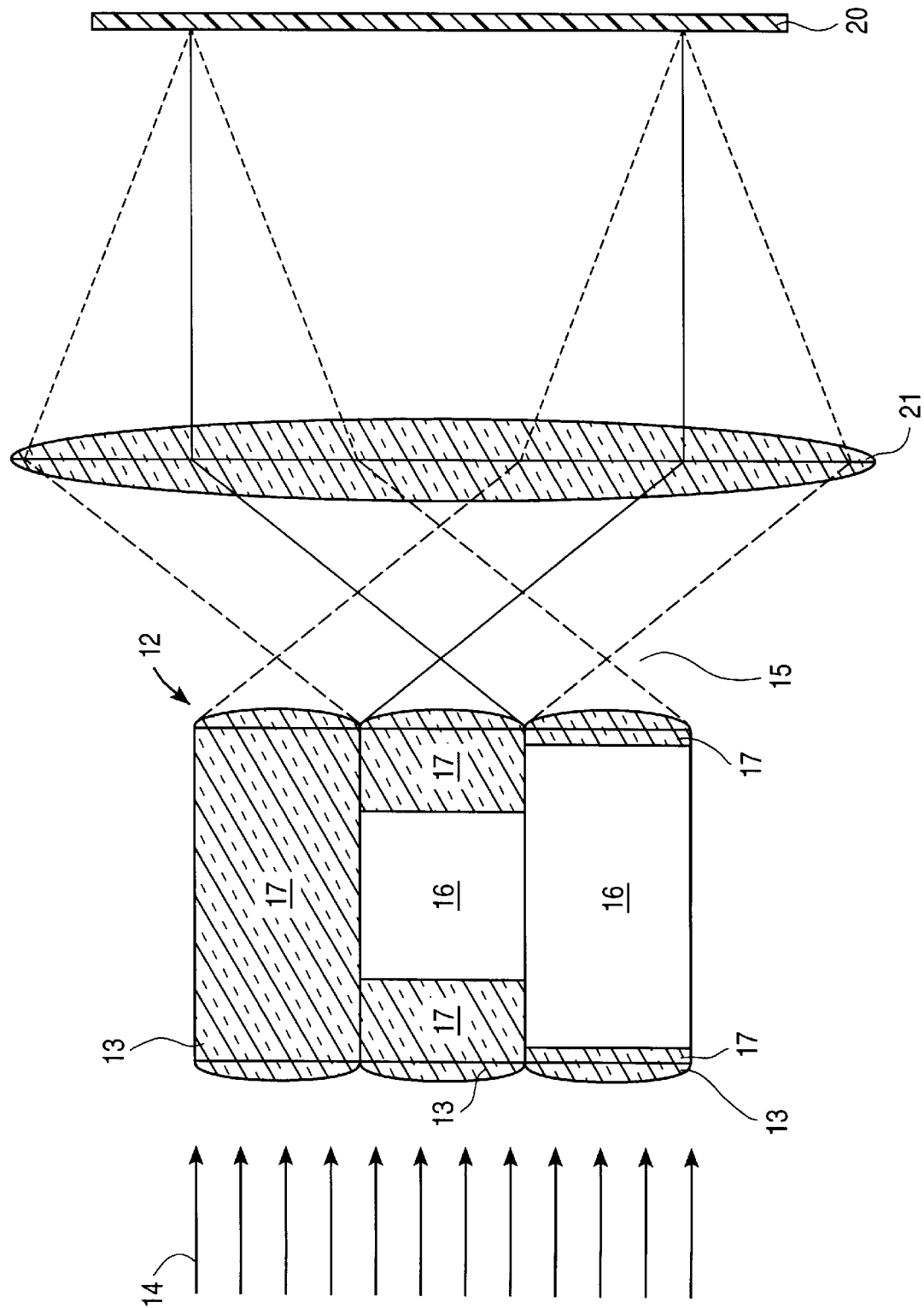
FIG. 3 is a cross-sectional view of a fly-eye lens arrangement of the preferred embodiment in which air gaps are present in the lens to introduce variable delay across the beam to reduce or remove speckle.

FIG. 3 shows a fly's eye lens arrangement (fly-eye array) 12 of the present invention in which compensation for the speckle is built into the lens themselves. Only three lens elements (lenses) 13 are shown as an example. The actual number will vary depending on the optical system employed. A narrow band light beam 14, such as a beam from a narrow band laser (a coherent light source), is projected onto one side of the fly-eye array 12 so that beamlets 15 exit from the other end of the lenses 13 of array 12. However, unlike the prior art fly-eye arrays, the array 12 of the present invention implements optical delays within the array 12 itself.

As noted in the drawing, air gaps 16 are designed and built into the lens elements themselves. In the three-lens array shown in FIG. 2, there is no air gap built into the top lens element. The middle lens element has a slight air gap while the bottom lens element has a much larger air gap built into it. The presence of the air gap 16 introduces a medium which is different than the lens medium 17. Thus, the transition time for light to traverse the full length of each lens element 13 will be determined by the length of the air gap 16 present in that lens element. Accordingly, the different length air gaps provide a variable amount of optical delay to be introduced in the array 12. Alternatively stated, the different lens elements 13 have the same focal length, but the length of the lens medium 17 varies among the different lenses. Typically, the lens elements 13 are fabricated from glass and the variable phase difference is introduced by the variation in the size of the air gaps 16. The array 12 provides a staggered temporal delay to remove or reduce the spatial coherence between the adjacent lens elements 13 of the array 12.

It is appreciated that all three of the lenses 13 have the same focal length, so that differences in the transition time of the beam through each lens is determined by the various lengths of the air gaps 16. The actual amount of the delay is determined by the properties of the two media selected (in this case air for gap 16 and glass for the lens medium 17) and the amount of variation of one medium in the other (in this case, length of air gap in the glass medium). It is desirable to maintain the same focal length for all lens elements, so that the focus is at a reticle plane 20, after the beams pass through a condenser lens 21. It is appreciated that the number of lenses 13 in an array is a design choice. Additionally, the array is usually arranged as a two-dimensional array having distribution of lenses in both X and Y directions along the cross-sectional plane of the beam.

It is appreciated that the particular optical path lengths of the array 12 are defined by spatial coherence properties of given lasers and given illumination systems. Spacing between the elements of the staggered fly-eye array 12 and the difference in the optical path length introduced by each lens element 13 must be chosen to be sufficient for the destruction (or reduction) of the laser beam spatial coherence over the area confined by the radii equal to the value of the transverse spatial coherence of the given line-narrowed laser. That is, the optical delays introduced by the elements 13 disrupt the spatial coherence of the beam which causes speckle.

Figure 4:
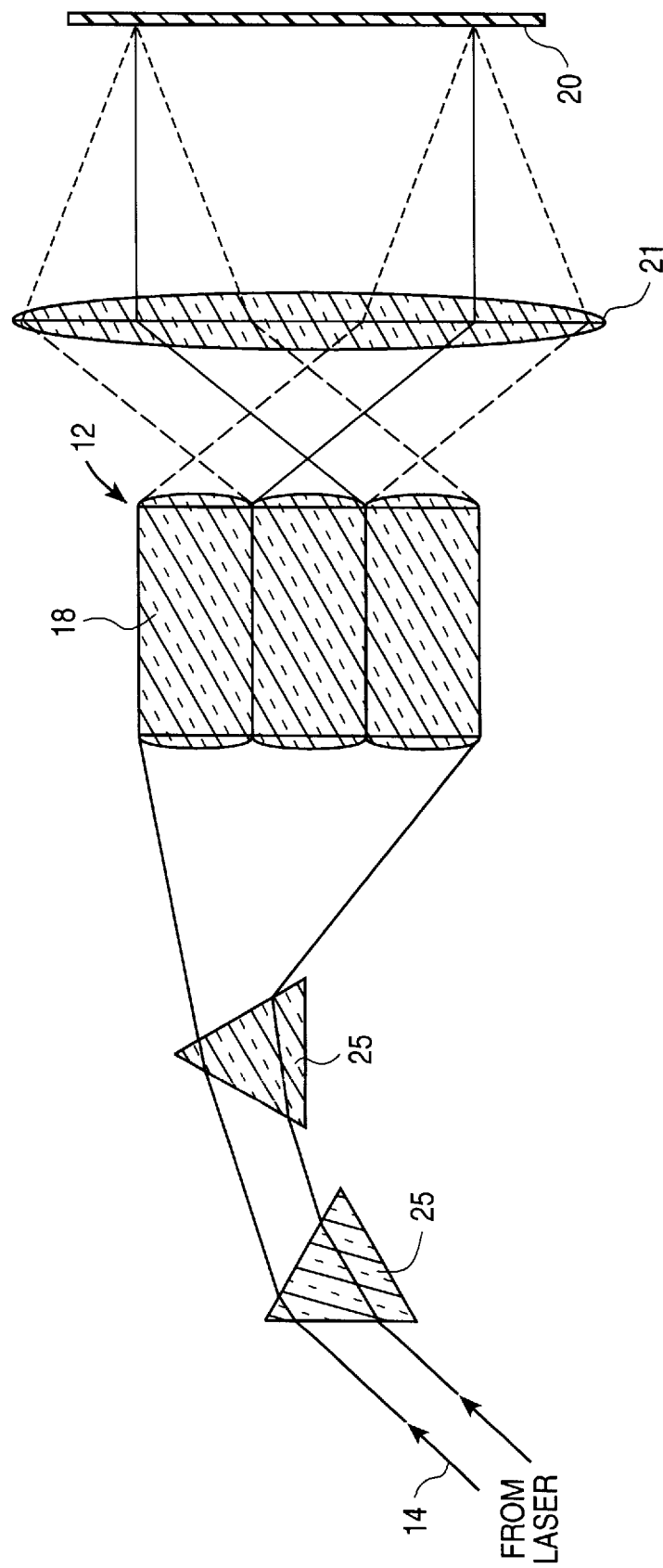
FIG. 4 is an alternative embodiment in which prisms are placed in the optical path to introduce variable phase delay to reduce or remove speckle.

Referring to FIG. 4, an alternative embodiment of the present invention is shown. Instead of utilizing a fly-eye array having the variable optical delays, a set of prisms 25 are used prior to a standard fly-eye array 18. Two prisms 25 are shown in the example illustration, but the actual number of such prisms need not be limited to two. The prisms 25 are placed in the path of the laser beam 14 so that a continuous variable delay is introduced across the width of the beam. As the beam 14 travels through the prism, variable delays are introduced since the path length through the prism varies across the beam. Thus, light traversing to the target transitions through a second medium (in this case glass prisms) in which the path length through this second medium is made continuously variable, in order to compensate for the spatial coherence of the laser. It is appreciated that this alternative technique need not rely on the use of prisms. Other means can be used as well, as long as phase delay is introduced between different portions of the beam so that spatial coherence is reduced to prevent or reduce interference at the target which produces speckle.

Two techniques were described above, one providing staggered (or step) variations in delay (air gaps in the fly-eye lens element approach) and the other providing continuous variations in delay (prism approach). In either instance, the presence of a second medium introduces variable length of transition for different parts of the light beam, therein introducing variable phase delays for portions of the beam to reduce the spatial coherence of narrow band coherent light sources. The delay elements are combined with a fly-eye lens arrangement, wherein the combination of the fly-eye array and the imposition of the variable delay provide for improved illumination uniformity at the target with reduced or no speckle.

It is appreciated that the preferred application of the present invention is to utilize it in a microlithography tool to image patterns on a semiconductor wafer for the fabrication of integrated circuit devices. However, the present invention need not be limited to such applications only. It can be readily adapted for other applications as well where speckle reduction is sought.

Thus, a technique for providing a specialized lens arrangement for improved imaging to achieve better illumination uniformity is described.

We claim:

1. An apparatus for providing improved illumination uniformity by reducing spatial coherence of transmitted light to remove speckle comprising:

a light source for generating a coherent beam of light to provide the transmitted light; and a set of fly's eye lens elements arranged to receive the transmitted light and disperse the transmitted light into a number of beamlets for projection onto a target, having the same focal length for imaging onto the target and, said lens elements having a plurality of lens media and a second medium disposed within at least one of said lens media, each said lens medium having a first light transition time, said second medium having a second light transition time different than said first light transition time.

2. The apparatus of claim 1 wherein said lens elements are comprised of glass and the second medium is comprised of air.

3. The apparatus of claim 1 wherein said lens elements are arranged into an array.

4. In a microlithography tool which is used to pattern images onto a semiconductor wafer, an apparatus for providing improved illumination uniformity by reducing spatial coherence of transmitted light to remove speckle comprising:

a coherent laser light source for generating a coherent beam of light to provide the transmitted light; and a set of fly's eye lens elements arranged to receive the transmitted light and disperse the transmitted light into a number of beamlets for projection onto the wafer, and having the same focal length for imaging onto the wafer, said lens elements having a plurality of lens media and a second medium disposed within at least one of said lens media, each said lens medium having a first light transition time, said second medium having a second light transition time different than said first light transition time.

5. The apparatus of claim 4 wherein said lens elements are comprised of glass and the second medium is comprised of air.

6. The apparatus of claim 4 wherein said lens elements are arranged into an array.

7. The apparatus of claim 4 wherein said light source is a narrow band laser.

8. An apparatus for providing improved illumination uniformity by reducing spatial coherence of transmitted light to remove speckle comprising:

a light source for generating a coherent beam of light to provide the transmitted light;

a set of fly's eye lens elements arranged to receive the transmitted light and disperse the transmitted light into a number of beamlets for projection onto a target, said lens elements having the same focal length for imaging onto a target; and a delay element disposed between said light source and lens elements to introduce a continuously variable delay within a single optical path, said continuously variable delay applied across the field of the transmitted light to reduce the spatial coherence of the transmitted light.

9. The apparatus of claim 8 wherein said delay element is a prism.

10. The apparatus of claim 8 wherein said delay element is comprised of a plurality of prisms arranged serially.

11. In a microlithography tool which is used to pattern images onto a semiconductor wafer, an apparatus for providing improved illumination uniformity by reducing spatial coherence of transmitted light to remove speckle comprising:

a light source for generating a coherent beam of light to provide the transmitted light;

a set of fly's eye lens elements arranged to receive the transmitted light and disperse the transmitted light into a number of beamlets for projection onto the wafer, said lens elements having the same focal length for imaging onto the wafer; and a delay element disposed between said light source and lens elements to introduce a continuously variable delay within a single optical path said continuously variable delay applied across the field of the transmitted light to reduce the spatial coherence of the transmitted light.

12. The apparatus of claim 11 wherein said delay element is a prism.

13. The apparatus of claim 11 wherein said delay element is comprised of a plurality of prisms arranged serially.

14. A method of improving illumination uniformity by reducing spatial coherence of transmitted light to remove speckle, comprising the steps of:

generating a coherent beam of light to provide the transmitted light;

arranging a set of fly's eye lens elements to receive the transmitted light and disperse the transmitted light into a number of beamlets for projection onto a target, and having the same focal length for imaging onto the target, said lens elements having a plurality of lens media and a second medium disposed within at least one of said lens media, each said lens medium having a first light transition time, said second medium having a second light transition time different than said first light transition time.

15. The method of claim 14 wherein said step of arranging the lens elements includes the step of providing lens elements that are comprised of glass and the second medium is comprised of air.

16. The method of claim 14 further including the step of imaging a pattern onto a semiconductor wafer in which the imaging is improved by the reduction of speckle.

17. A method of improving illumination uniformity by reducing spatial coherence of transmitted light to remove speckle, comprising the steps of:

generating a coherent beam of light to provide the transmitted light;

arranging a set of fly's eye lens elements to receive the transmitted light and disperse the transmitted light into a number of beamlets for projection onto a target, the lens elements having the same focal length for imaging onto a target; and inserting a delay element across the field of the transmitted light prior to the lens elements to introduce a continuously variable delay within a single optical path to reduce the spatial coherence of the transmitted light.

18. The method of claim 17 wherein said step of inserting the delay element includes the step of providing at least one prism.

19. The method of claim 18 further including the step of imaging a pattern onto a semiconductor wafer in which the imaging is improved by the reduction of speckle.

* * * * *